United States Patent
Heuser et al.

(10) Patent No.: US 9,570,686 B2
(45) Date of Patent: Feb. 14, 2017

(54) ORGANIC LIGHT EMITTING DIODE WITH INCREASED RADICAL ANION STABILITY AND APPLICATIONS THEREOF

(75) Inventors: Karsten Heuser, Erlangen (DE); Arvid Hunze, Erlangen (DE); Andreas Kanitz, Höchstadt (DE)

(73) Assignee: OSRAM OLED GmbH, Regensburg (DE)

( * ) Notice: Subject to any disclaimer, the term of this patent is extended or adjusted under 35 U.S.C. 154(b) by 2194 days.

(21) Appl. No.: 11/658,772

(22) PCT Filed: Jul. 26, 2005

(86) PCT No.: PCT/EP2005/053635
§ 371 (c)(1),
(2), (4) Date: Mar. 10, 2008

(87) PCT Pub. No.: WO2006/010757
PCT Pub. Date: Feb. 2, 2006

(65) Prior Publication Data
US 2009/0001873 A1    Jan. 1, 2009

(30) Foreign Application Priority Data
Jul. 28, 2004   (DE) .................. 10 2004 036 496

(51) Int. Cl.
| | | |
|---|---|---|
| H01L 51/50 | (2006.01) | |
| H01L 51/00 | (2006.01) | |
| C09K 11/06 | (2006.01) | |

(52) U.S. Cl.
CPC ....... *H01L 51/0043* (2013.01); *H01L 51/0079* (2013.01); *H01L 51/5048* (2013.01); *C09K 11/06* (2013.01); *C09K 2211/14* (2013.01); *C09K 2211/1408* (2013.01); *C09K 2211/1416* (2013.01); *C09K 2211/1433* (2013.01); *C09K 2211/186* (2013.01); *C09K 2211/188* (2013.01); *H01L 51/50* (2013.01); *H01L 51/5012* (2013.01)

(58) Field of Classification Search
CPC ............ H01L 51/0043; H01L 51/0079; H01L 51/5048; H01L 51/50; H01L 51/5012; C09K 11/06; C09K 2211/14; C09K 2211/1416; C09K 2211/1408; C09K 2211/1433; C09K 2211/186; C09K 2211/188

USPC ............ 428/690, 691, 917; 427/58, 66; 313/500–512; 257/40, 88–104, 257/E51.001–E51.052; 252/301.16–301.35

See application file for complete search history.

(56) References Cited

U.S. PATENT DOCUMENTS

| | | | |
|---|---|---|---|
| 6,406,804 B1 * | 6/2002 | Higashi et al. ............... | 428/690 |
| 2001/0026878 A1 * | 10/2001 | Woo et al. .................... | 428/690 |
| 2002/0028351 A1 * | 3/2002 | Wang et al. .................. | 428/690 |
| 2002/0032288 A1 | 3/2002 | Tanaka et al. | |
| 2003/0006411 A1 | 1/2003 | Kido et al. | |
| 2003/0146443 A1 | 8/2003 | Yamazaki et al. | |
| 2004/0124425 A1 | 7/2004 | Yamazaki et al. | |
| 2005/0156516 A1 * | 7/2005 | Wang et al. .................. | 313/504 |
| 2008/0124569 A1 * | 5/2008 | Kathirgamanathan et al. ............................. | 428/690 |
| 2011/0108819 A1 * | 5/2011 | Kathirgamanathan et al. ............................. | 257/40 |

FOREIGN PATENT DOCUMENTS

| | | |
|---|---|---|
| DE | 10 2004 015 845 | 11/2005 |
| DE | 10 2004 023 221 A1 | 12/2005 |
| DE | 698 33 385 | 9/2006 |
| JP | 2000-123972 | 4/2000 |
| JP | 2001-135481 | 5/2001 |
| JP | 2001-284052 A | 10/2001 |
| JP | 2003-031365 | 1/2003 |
| JP | 2003-229275 | 8/2003 |
| WO | WO 99/20081 | 4/1999 |
| WO | WO 2005/096402 | 10/2005 |

OTHER PUBLICATIONS

Yamazaki et al., JP(2003)—229275, machine assisted translation.*
German Examination Report dated Apr. 2, 2007 issued for the corresponding German Application No. 10 2004 036 496.6-44.

* cited by examiner

*Primary Examiner* — Jennifer Chriss
*Assistant Examiner* — Dylan Kershner
(74) *Attorney, Agent, or Firm* — Cozen O'Connor

(57) ABSTRACT

An organic light emitting diode (OLED) having an improved service life and improved transport of negative charge carriers. The organic light emitting diode based on an organic semiconductor material in which the transport of negative charge carriers and the stability with respect to reduction are determined by azahetarylene/Lewis acid complex units. This leads to an improved service life of the emission layer, which firstly increases the service life of the component and avoids readjustment of the brightness during operation. Organic light emitting diodes are disclosed in which the position of the emission zone in the emitter layer and the color of the emission can be specifically influenced by azahetarylene/Lewis acid complex units.

3 Claims, 1 Drawing Sheet

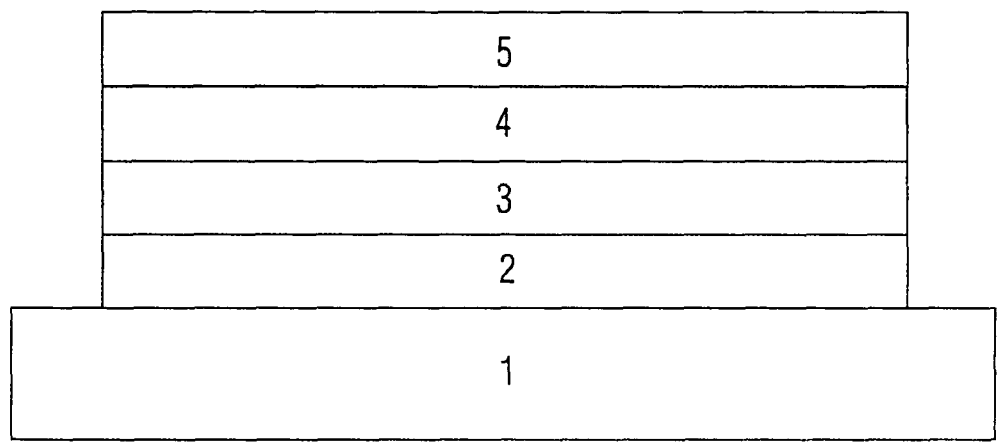

ORGANIC LIGHT EMITTING DIODE WITH INCREASED RADICAL ANION STABILITY AND APPLICATIONS THEREOF

RELATED APPLICATIONS

This is a U.S. national stage of application No. PCT/EP2005/053635, filed on Jul. 26, 2005.

This patent application claims the priority of German patent application no. 10 2004 036 496.6 filed Jul. 28, 2004, the disclosure content of which is hereby incorporated by reference.

FIELD OF THE INVENTION

The invention relates to an organic light emitting diode (OLED) having an improved service life and improved transport of negative charge carriers.

BACKGROUND OF THE INVENTION

An OLED comprises as a rule at least one lower, at least semitransparent electrode, a hole-transporting layer, i.e. a layer comprising charge transport material which is suitable for transporting positive charges, an emitter layer, a layer for transporting negative charges and finally an upper electrode.

In order to manage with as few layers as possible in an OLED, attempts have been made to use, as an emitter layer, an electron-deficient material in which an electron excess can be stabilized. It is thus possible to omit the layer between emitter material and negative electrode.

OLEDs based on semiconductor material having, for example, a skeleton of polyarylenevinylene or poly-para-phenylene (in particular polyfluorene and/or poly-spiro-fluorene), in which, in addition to these constituents, proportions of further chromophores and/or molecules having electronegative centers are also incorporated in the form of polymerized units or introduced in the form of blends are known. The molecules having electronegative centers all have as a rule at least one nitrogen atom by means of the electronegativity of which (in comparison with carbon) an excess electron can be stabilized in the existing $\pi$-conjugation.

With the above-described organic semiconductor materials for active layers of an OLED, it is possible at present to cover a large range of the possible CIE (International Commission on Illumination) color coordinates and to achieve relatively high luminances and efficiencies which are relevant for commercial applications. However, the operating life of the polymer OLEDs has to date been too low to become established on the market. This applies in particular to the shorter-wave, i.e. the blue and white emitting light emitting diodes and/or displays, such as the so-called passive matrix displays.

A disadvantage of stabilization by means of a nitrogen atom is, however, that the electron loan pair of the nitrogen has an n-$\pi^*$ transition and an additional electron is therefore raised to a $\pi^*$ energy level and falls into an n-level. It thereby emits radiation which is no longer in the visible range and adds nothing to the luminosity of the OLED.

SUMMARY OF THE INVENTION

It is therefore an object of the present invention to provide an OLED, the radical anions formed during operation being stabilized by $\pi$ electron-deficient structural units even within the emitter layer without reducing the luminosity of the layer.

This and other objects are attained in accordance with one aspect of the invention directed to an organic light emitting diode or illuminated display, comprising at least one substrate, a lower, at least semitransparent electrode, a hole-conducting layer, an emitter layer and an upper electrode, an organic electron acceptor complex being introduced into at least one of the layers.

Another aspect of the invention relates to the use of the organic light emitting diode for illumination purposes and/or for monochrome, multicolor or full-color organic illuminated displays based on color filters or structured, RGB-pixellated emitter layers, and for passive matrix displays.

An organic electron acceptor complex according to an embodiment of the invention is distinguished in that at least one electronegative center is present in the compound, such as, for example, a nitrogen atom having a so-called electron loan pair which has an n-$\pi^*$ transition, the n-$\pi^*$ transition of the loan pair being blocked by complexing with a Lewis acid and therefore an electron which is stabilized at the electronegative center within the compound being held in the $\pi$-$\pi$ energy level and thus emitting shorter-wave radiation and/or in the visible range.

In this context, "introduced" is to be understood as meaning that the organic electron acceptor complex, in particular a so-called azahetarylene/Lewis acid complex, is either copolymerized in a copolymer with other units, such as polyarylenevinylene or poly-para-phenylene (in particular polyfluorene and/or poly-spiro-fluorene) units or that a blend is present in which the organic electron acceptor complex was mixed (blended) as a polymer with at least one further polymeric organic semiconductor material. The two alternatives may also be present simultaneously together so that, for example, firstly a blend of a plurality of polymers, inter alia a polymeric material comprising azahetarylene/Lewis acid complex units and secondly a copolymer having a repeating unit comprising azahetarylene/Lewis acid complex are present.

The organic electron acceptor complex improves the transport of negative charge carriers by the stabilized radical anions formed during operation of the organic light emitting diode and thus increases the stability of the polymer with respect to electrochemical reduction which inevitably occurs during the transport of the negative charge carriers.

For example, an azahetarylene/Lewis acid complex is an organic electron acceptor complex according to an embodiment of the invention, the term azahetarylene/Lewis acid complex being understood as meaning an aromatic, $\pi$ electron-deficient, mononuclear or polynuclear heterocycle which comprises by bivalently arranged substituents suitable for the Suzuki coupling reaction, contains at least one nitrogen atom as a heteroatom and is complexed via the nitrogen in the heterocycle by a chemical compound acting as a Lewis acid. Substituents suitable for the Suzuki coupling reaction are, for example, bromine or halogen on the one hand and boric acid on the other hand. Bivalent designates that, for the formation of a polymer, a molecule must have two, bivalently arranged substituents suitable for coupling, one at the head and one at the tail.

$\pi$ electron-deficient heterocycles are those whose total $\pi$ electron density divided by the number of ring members of the heterocycle is less than 1. This value can be calculated for the respective heterocycles from a quantum mechanical formalism. Further heteroatoms in the aromatic heterocycle may be nitrogen, oxygen and sulfur. The term Lewis acid is understood as meaning a chemical compound having an incomplete electron configuration, i.e. for example trivalent compounds of boron or of aluminum.

Azahetarylene/Lewis acid complex units are particularly suitable for use as electron-transporting components of a copolymeric organic semiconductor material since this component not only can accept a negative charge, resulting in the formation of stabilized radical anions, but also simultaneously represents an additional emitter system in the polymer.

In contrast to the highly reactive radical carbanions of a conjugated hydrocarbon system, no irreversible secondary reactions are to be expected here.

Suitable Lewis acids are, for example, those based on boron or aluminum. Boron-based Lewis acids are particularly suitable.

In contrast to the highly reactive radical carbanions of a conjugated hydrocarbon system, no irreversible secondary reactions are to be expected here.

The azahetarylene/Lewis acid complex units as a stable electron transport unit can be used for negative charges analogously to the already known use of triarylamine derivatives as a stable hole-transporting unit for positive charges.

Advantageously, the azahetarylene/Lewis acid complex units LA are boron or aluminum complexes of nitrogen-containing aromatic π-deficient heterocycles, the aryl compounds with heteroatom, also referred to below as "het-arenes", advantageously containing the moiety 1. Here, "nitrogen-containing" means that at least one nitrogen atom is bonded in the aromatic ring system, it also being possible for any other heteroatoms to be bonded in the ring system. An aromatic system which is electron-poor because the π electron density remains at the negative center and is not distributed uniformly over the system is referred to as an aromatic π-deficient heterocycle.

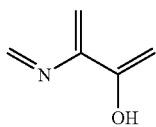

1

The ring members of the hetarene and the substituents thereof and the positions of the polymeric linkage outside the lead structure can be freely chosen.

Those derivatives of 8-hydroxyquinoline whose positions for the polymeric linkage are advantageously substituted by alkyl- and/or alkoxy-functionalized aromatics for better solubility, and those derivatives of 8-hydroxyquinoline which carry substituents suitable for the Suzuki coupling for copolymerization are preferred.

What is not critical is the choice of the ligands $L^1$ to $L''$ of the ligand field of the lead structure complex 2, which ligands are not required for the polymeric linkage. These may be any desired organic radicals R or OR, alkoxy or alkyl, etc., both monodentate and polydentate. A tetravalent complex having two freely selectable ligands $L^1$ and $L^2$ is mentioned by way of example.

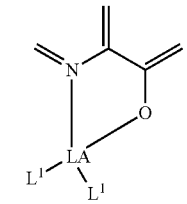

2

Preparation of the copolymeric material:

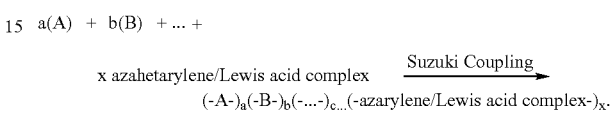

A, B, . . . are the monomer units which are copolymerized with the azahetarylene/Lewis acid complex, i.e. any desired bivalent, aromatic monomer units which are provided with substituents for enabling Suzuki coupling reaction, for example, 2,7-disubstituted 9,9-dialkylfluorenes.

a, b, c, . . . , x are mole fractions of the monomer units or repeating units.

According to one embodiment, the organic semiconductor material of at least one active layer of the OLED comprises 50% of the repeating units of arylenevinylene and/or para-phenylene derivative units and from 1 to 50% of the repeating units, preferably from 1 to 30% and particularly preferably from 1 to 20% of an organic electron acceptor complex, preferably azahetarylene/Lewis acid complex units. It is also particularly preferred if fluorene derivative units and/or poly-spiro-fluorene units are used as para-phenylene derivative units.

According to a further embodiment, the organic semiconductor material of at least one active layer of the OLED also comprises from 1 to 49% of repeating units of triarylamine derivative units, in particular from 1 to 30% of repeating units of the triarylamine units and particularly preferably from 1 to 20% thereof.

According to one embodiment, the organic electron acceptor complex in the organic semiconductor material exhibits a blue emission or has no marked influence on the emission spectrum (shift less than 30 nm).

In a particularly advantageous embodiment of the invention, triarylamine/ and azahetarylene/Lewis acid complex units are combined in an organic semiconductor material of at least one active layer so that efficiency and operating life are optimized for certain driver conditions, such as, for example, for passive matrix actuations at a given multiplex rate, pulse frequency and/or brightness.

According to an embodiment of the invention, the proportion of the negative charge carriers in the total current and hence the efficiency of the organic light emitting diode and the position of the recombination zone within the layer can be optimized by using azahetarylene/Lewis acid complex electron-transporting units.

BRIEF DESCRIPTION OF THE DRAWING

The drawing shows an organic light-emitting diode with a lower electrode, a hole-conducting layer, an emitter layer and an upper electrode on a substrate.

DETAILED DESCRIPTION OF THE DRAWING

The substrate 1, with a lower electrode 2, a hole-conducting layer 3 of an emitter layer of organic semiconductor material 4 and an upper electrode 5 are shown. According to an embodiment of the invention, in spite of good emission properties, the emitter layer 4 also assumes the properties of the charge-transporting layer for the negative charges because it has an organic electron acceptor complex, preferably an azahetarylene/Lewis acid complex. In one embodiment, the hole-conducting layer 3, which is present between the lower, at least semitransparent electrode and the emitter layer, comprises a polymeric triarylborane according to the still unpublished patent application 10 2004 023 221.0.

The invention provides for the first time an organic light emitting diode comprising an organic electron acceptor complex, preferably an azahetarylene/Lewis acid complex component as an electron-transporting unit in an organic semiconductor material of an active layer, in which the problem of insufficient reduction stability of conjugated hydrocarbon polymers is overcome. The azahetarylene/Lewis acid complex units provide reducibility of the entire organic semiconductor material of the active layer, which reducibility is reversible in the long term, and hence a longer service life of the light emitting diode during operation. In addition, by specific variation of the proportion of, for example, azahetarylene/Lewis acid complex units, an improvement of the efficiency and/or control of the position of the emission zone within the active layer of organic semiconductor material is possible.

The invention relates to an organic light emitting diode (OLED) having an improved service life and improved transport of negative charge carriers. The organic light emitting diode based on an organic semiconductor material in which the transport of negative charge carriers and the stability with respect to reduction are determined by azahetarylene/Lewis acid complex units. This leads to an improved service life of the emission layer, which firstly increases the service life of the component and avoids readjustment of the brightness during operation. In addition, the invention relates to those organic light emitting diodes in which the position of the emission zone in the emitter layer and the color of the emission can be specifically influenced by azahetarylene/Lewis acid complex units.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An organic light emitting diode or illuminated display, comprising:
   at least one substrate;
   a lower, at least semitransparent electrode;
   a hole-conducting layer;
   an emitter layer; and
   an upper electrode;
   wherein tetravalent azahetarylene/Lewis acid complex units copolymerized in a copolymer with monomer units of polyfluorene, wherein a monomer unit is 9, 9-dialkylfluorene, wherein the copolymer is introduced into at least one of the layers;
   wherein the azahetarylene/Lewis acid complex units act as electron-transporting components and comprise a structural unit in accordance with the relationship:

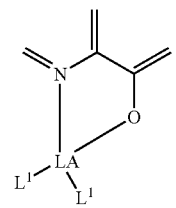

LA being a Lewis acid central atom, wherein the Lewis acid central atom is boron, $L^1$ and $L^2$ being monodentate alkoxy or alkyl organic radicals, wherein the bidentate ligand of the azahetarylene/Lewis acid complex units are derivatives of 8-hydroxyquinoline and wherein the 9, 9-dialkylfluorene units are linked to the azahetarylene/Lewis acid complex units via the bidentate ligands of the 8-hydroxyquinoline-derivatives.

2. The organic light emitting diode or illuminated display as claimed in claim 1, wherein the organic light emitting diode or illuminated display is implemented at least one of for illumination purposes, for one of monochrome, multicolor or full-color organic illuminated displays based on color filters or structured, RGB-pixellated emitter layers, and for passive matrix displays.

3. The organic light emitting diode or illuminated display as claimed in claim 1, wherein the azahetarylene/Lewis acid complex units are in the emitter layer.

* * * * *